United States Patent [19]

Johannessen

[11] 4,230,955
[45] Oct. 28, 1980

[54] METHOD OF AND APPARATUS FOR ELIMINATING PRIMING AND CARRIER SWEEP-OUT LOSSES IN SCR SWITCHING CIRCUITS AND THE LIKE

[75] Inventor: Paul R. Johannessen, Lexington, Mass.

[73] Assignee: Megapulse Incorporated, Bedford, Mass.

[21] Appl. No.: 893,966

[22] Filed: Apr. 6, 1978

[51] Int. Cl.³ .................. H03K 17/72; H03K 17/292
[52] U.S. Cl. ........................ 307/252 J; 307/252 M; 361/204; 361/205; 363/57; 363/124
[58] Field of Search ........... 307/252 R, 252 J, 252 M, 307/252 N, 305, 237; 328/67; 361/159, 204, 205; 363/57, 124; 323/7, 74, 83

[56] References Cited

U.S. PATENT DOCUMENTS

| | | | |
|---|---|---|---|
| 3,652,874 | 3/1972 | Partridge | 307/252 M |
| 3,714,467 | 1/1973 | Kariya et al. | 307/252 M |
| 3,942,094 | 3/1976 | Akamatsu | 307/252 M |

*Primary Examiner*—John Zazworsky
*Attorney, Agent, or Firm*—Rines and Rines, Shapiro and Shapiro

[57] ABSTRACT

This disclosure is directed to SCR charging or other energy-switching circuits provided with priming and carrier sweep-out networks and the like that normally incur energy losses in the priming and sweep-out processes, wherein such losses are obviated by transferring energy resulting from such processes back to the power supplies.

11 Claims, 9 Drawing Figures

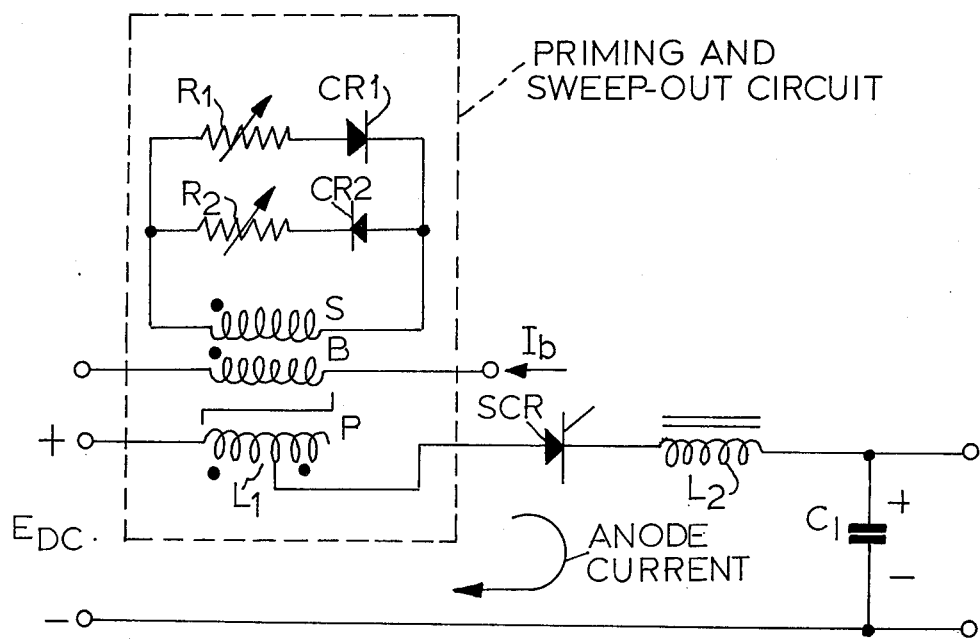
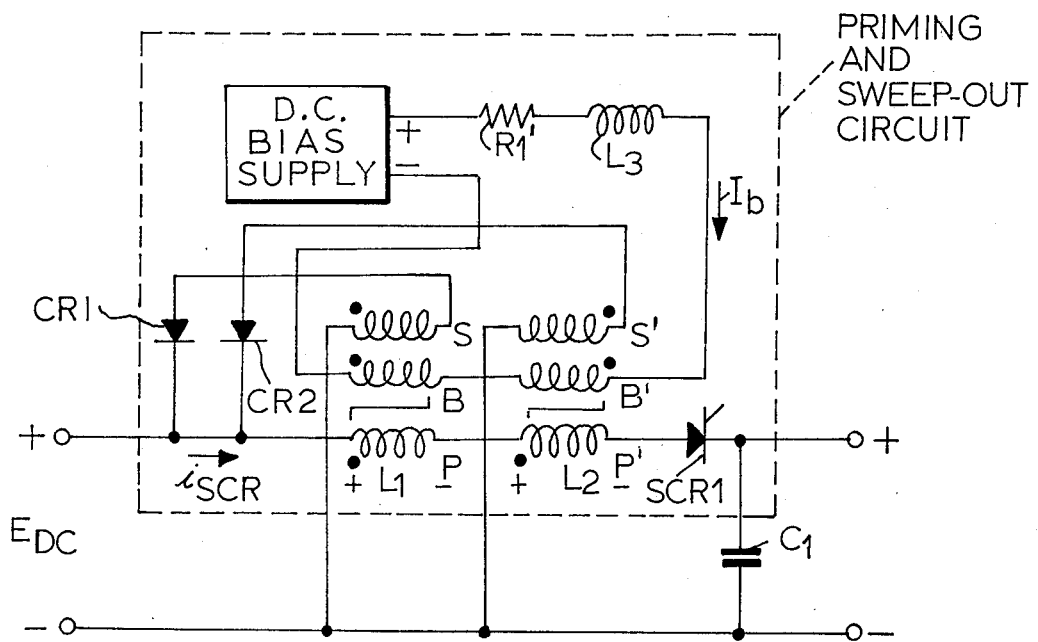
FIG.2

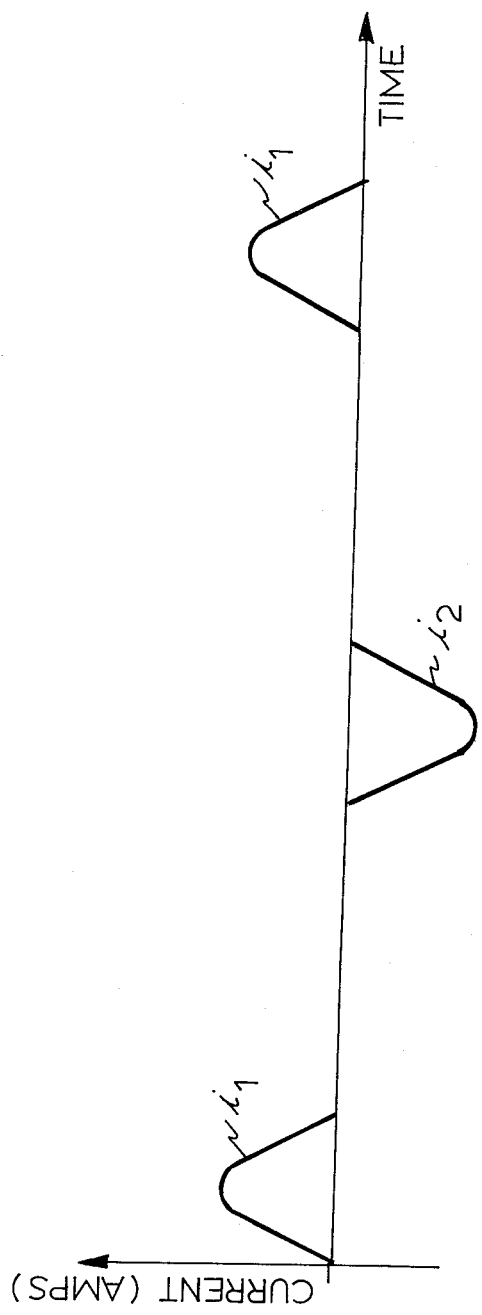
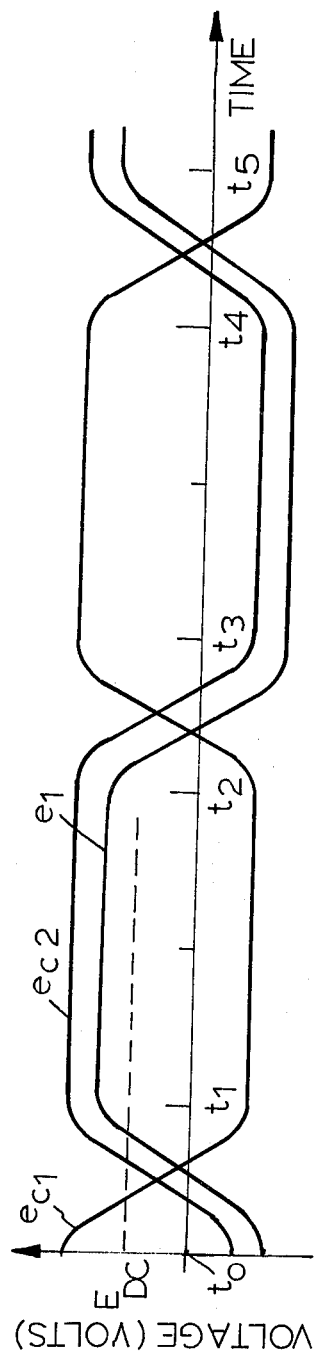
FIG.8a
FIG.8b

METHOD OF AND APPARATUS FOR ELIMINATING PRIMING AND CARRIER SWEEP-OUT LOSSES IN SCR SWITCHING CIRCUITS AND THE LIKE

The present invention relates to methods of and apparatus for increasing the efficiency of solid-state and similar switching relays, as of the silicon-controlled rectifier type and the like, hereinafter generically referred to as SCR switching devices; the invention being more particularly directed to eliminating the losses heretofore inherent in systems provided with priming and carrier sweep-out networks.

Typical applications for such switching devices and circuits are radar modulators, frequency changers, DC-DC power converters, DC to AC power inverters, and RF transmitters and the like in which the basic power conversion is accomplished by means of SCRs. Systems of this nature are described, for example, in my prior U.S. Pat. Nos. 4,001,598; 3,832,573; and 3,889,263. By increasing the SCR switching efficiency, the thermal loss is reduced and this, in turn, allows increased current rating.

For conventional current pulse generators of the SCR type, the magnitude and pulse width of the generated current pulses are limited by the maximum di/dt rating, the electrical on-state conductivity, the thermal junction conductivity, the thermal junction capacitance, and the peak junction temperature.

For sinusoidal current pulses, the (di/dt) maximum is given by the relationship $$(di/dt)_{max} = \pi (I_{peak}/T), \qquad (1)$$

where T is the width of the current pulse and $I_{peak}$ its peak current value.

In pulse applications, the SCR junction heats up during the pulse generation interval and then cools down in the interval between pulses. Thus, the junction temperature consists of a DC component and an AC ripple component. If the pulse width is much larger than the thermal time-constant, then the AC ripple component is much larger than the DC component, resulting in a considerable decrease in the heat flow from the junction for a given maximum junction temperature, since the heat flow is proportional to the difference between the average junction temperature and the ambient. As a result, the RMS current rating of the device is reduced. If the pulse width is much smaller than the thermal time-constant, on the other hand, then the ripple component is small compared to the DC component and the junction operates at its maximum-rated temperature continuously, with no decrease in heat flow resulting. Thus, the maximum RMS current rating of the SCR can be realized. The maximum pulse repetition rate is determined by the allowable RMS current, such that the peak junction temperature is not exceeded.

This discussion, however, has ignored a significant source of heat dissipation in the junction that is associated with the reverse recovery characteristic of the SCR. At the end of the current pulse, minority carriers are stored in the junction and these carriers conduct current in the reverse direction of the SCR. The minority carriers act like stored charge and are completely removed from the junction when the sum of the integral of the reverse current and the minority carrier recombination charge is equal to the initial minority carrier charge. The reverse current, in turn, generates a reverse voltage drop across the junction which can be appreciable during the recovery interval. Thus, considerable heat dissipation may occur during the reverse recovery interval; and this loss increases with decreasing pulse width. The RMS current rating thus decreases with decreasing pulse width.

An object of the present invention is to provide a novel method of and apparatus for greatly decreasing these reverse recovery losses in the SCR.

The basic reason for the limited di/dt rating of an SCR is that, upon application of a gate signal, only a small area of the junction is actually turned on. If the external circuit forces the SCR to conduct too much current through this small area, localized junction temperature rise burns it out. The mechanism of turn-on is characterized by a finite spreading velocity of the order of 3000 to 8000 cm/second. In other words, initially, only the junction area near the gate structure is turned on; then the turned-on area spreads out from the periphery of the gate structure with a speed referred to as the spreading velocity. If complicated gate structures are used, the total spreading distance can be made small such that total turn-on can be achieved in 10 to 20 μsec. This complicated gate structure, however, decreases the junction area and thereby decreases the current capability of the device.

Because of the spreading effect in the turn-on mechanism, the junction area that is turned on increases with time. This, in turn, increases the di/dt capability of the device with time. Thus, one way of increasing the di/dt rating of the SCR is to delay the anode current pulse, as by means of a network in series with the SCR, preferably of the saturable inductor type. This saturable inductor acts like a time delaying switch. When the SCR trigger signal is applied, the saturable inductor is in its unsaturated state, and thus represents a high impedance. Only a small amount of current can then flow in the circuit. During this initial time interval, the voltage applied to the saturable inductor drives it toward saturation, at which time the inductor becomes a low impedance, and the full anode current can start to flow. The time of saturation is determined by the core cross-sectional area and the number of turns on the inductor.

Such use of a saturable inductor as a time-delaying switching means has been extensively used in the past to increase the di/dt rating of an SCR—this technique being referred to as "priming." As will later be made evident, however, the priming networks inherently introduce dissipation losses.

A further object of the invention, accordingly, is to provide a novel method and apparatus that greatly reduce, and indeed substantially eliminate, such priming losses.

The before-mentioned reverse current generation of a reverse voltage drop across the SCR junction also may produce considerable heat dissipation during the reverse recovery interval. So-called "sweep-out" circuits, including inductors, for limiting the reverse current, still result in dissipation of energy associated with the minority carrier sweep-out process as later more fully explained.

An additional object of the invention is to provide a new and improved method of and apparatus for appreciably reducing and even substantially eliminating such dissipated minority carrier sweep-out losses, as well.

Other and further objects will be explained hereinafter and are more fully delineated in the appended claims.

In summary, from one of its important aspects, the invention embraces a method of eliminating priming and carrier sweep-out losses in SCR switching circuits associated with power supplies and in which energy is stored in response to such switching, said method comprising delaying the rise of SCR current upon such switching for a predetermined priming interval, thereby also generating additional minority carriers in the SCR; limiting the current during the priming interval, thereafter generating a reverse voltage to effect sweep-out of such minority carriers during a sweep-out interval; limiting the current during sweep-out interval; and transferring the energy resulting in each of said priming and sweep-out intervals back to said power supplies to eliminate heat dissipation of the said resulting energy. Preferred details are hereinafter set forth.

The invention will now be described with reference to the accompanying drawings, FIG. 1 of which is an explanatory graph of the current vs. time characteristics of an SCR;

FIG. 2 is a circuit diagram of circuit apparatus for SCR priming and minority carrier sweep-out functions;

FIG. 4 is a circuit diagram of a preferred apparatus constructed in accordance with the invention and involving the novel method thereof;

FIGS. 8 (a) and (b) are waveforms bearing upon the circuit of FIG. 7.

Figure 1:
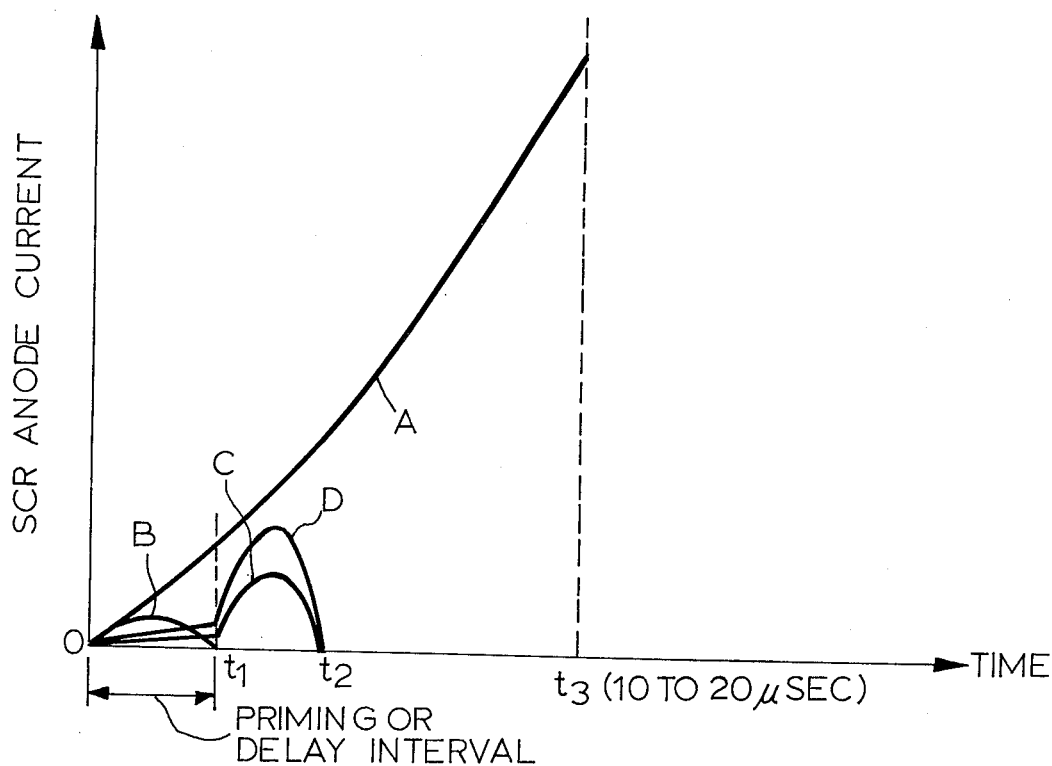

In order more fully to explain the principles underlying the invention, reference will first be made to the graphs of FIG. 1 illustrating the turn-on characteristics of an SCR with and without priming; anode current being plotted along the ordinate, and time along the abscissa. The curve labeled A represents the maximum allowable rate-of-rise (di/dt) or anode current as a function of time. To compare the relative increase in anode current that can be achieved with and without priming, three additional current waveforms are sketched in FIG. 1. Curve B represents a sinusoidal anode current, say, of 5 μsec width with no priming. The peak magnitude of this current pulse is determined by the di/dt rating at time zero. Curve C, on the other hand, represents the anode current with a priming time (o-t), of 5 μsec. It will be noted that a small amount of anode current flows during the priming interval. By increasing the anode current during such priming interval, further increase in the di/dt rating can be obtained; and this increase, in turn, increases the peak anode current, as is evident from Curve D. The anode current during the priming interval generates additional minority carriers in the turned-on junction area and thereby permits increased di/dt rating; though this anode current does not, however, increase the junction turned-on area. Such area is strictly a function of the time duration of the priming interval. Additional minority carriers in the turned-on area permit an increase in the anode current. Thus, the di/dt rating depends upon two parameters; the time duration of the priming interval, and the magnitude of the anode current during this interval.

A priming and minority carrier sweep-out circuit is shown in FIG. 2, comprising a saturable inductor L1 with a square-loop core, a tapped primary winding P, a bias or reset winding B, and a secondary winding S shunted by a pair of diodes CR1 and CR2, respectively in series with adjustable resistors R1 and R2. For a fixed anode current, these adjustable components are set to the optimum values. This priming and sweep-out circuit is connected with the primary winding P of the saturable inductor L1 in series between the +terminal of the power supply $E_{DC}$ and the SCR, and a resonant charging inductor L2 then series-connects the SCR to the +terminal of a shunt storage capacitor $C_1$.

The priming interval time duration is adjusted by selecting different taps on the primary winding P. During the priming interval, the voltage across the saturable inductor is positive and diode CR1 conducts. The amplitude of the priming current is adjusted by means of resistor R1. During the reverse recovery interval, the inductor voltage is negative so that diode CR2 conducts. The reverse recovery current is adjusted by means of resistor R2. In many applications, the resistance values of R1 and R2 are almost the same; and in these cases, the secondary circuit may consist only of one resistor. For high-frequency operation particularly, the priming loss dissipated in R1 is appreciable.

Figure 3:
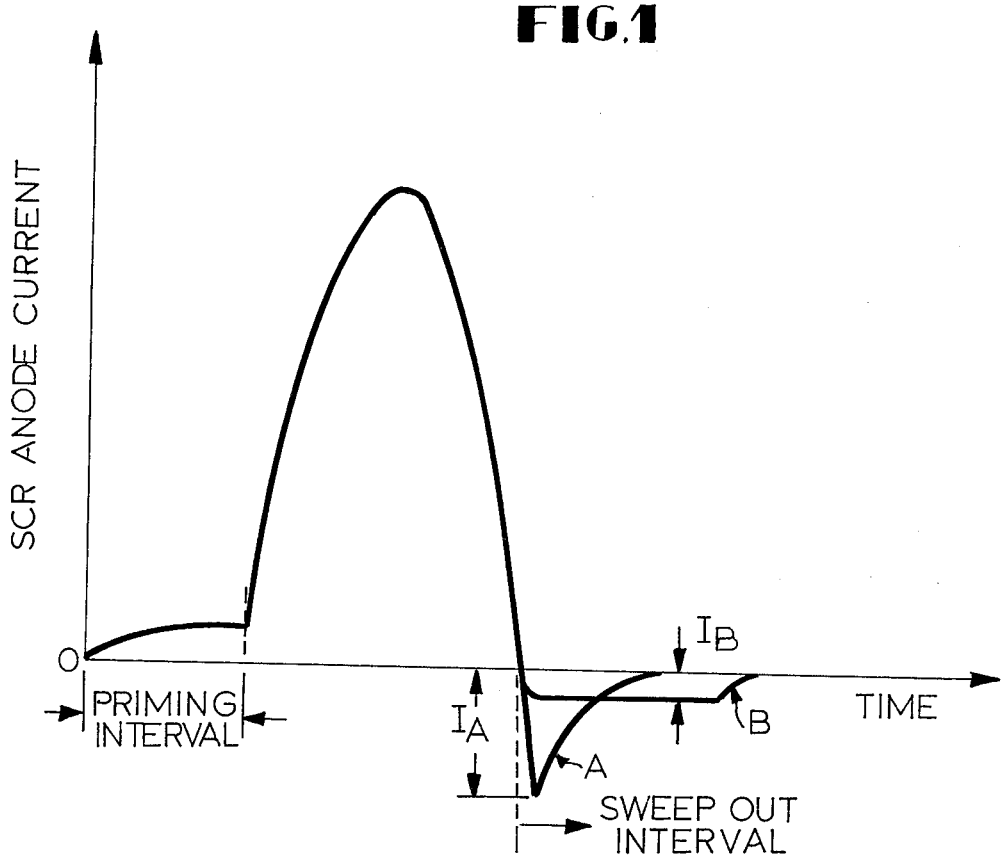
FIG. 3 is a graph of SCR current waveforms resulting from the circuit of FIG. 2.

The before-mentioned reverse recovery characteristic of the SCR is shown in FIG. 3. Without the priming and sweep-out circuit, the reverse current $I_A$ builds up to a large peak value, as illustrated in Curve A of FIG. 3. Since this reverse current flows through the charging inductor L2 of FIG. 2 and the saturated inductance of L1, a considerable amount of energy is stored in these inductors and this energy dissipates in the SCR during reverse recovery. Such reverse current may cause two types of failures: one due to excess power dissipation; and the other due to reverse voltage breakdown. The sweep-out feature of this circuit, however, limits the reverse current to a value controlled by the resistor R2, as shown by Curve B in FIG. 3. The optimum value of R2 is obtained when the current $I_B$ is minimized. The square-loop core allows the SCR turnoff to be controlled by limiting the reverse-current pulse to a safe value. An additional bias current is generally applied to the square-loop core in the reset direction to insure core reset, in the event that the SCR's recombination process is completed prior to reverse saturation.

In the circuit of FIG. 2, the resonant charging generates a voltage across C1 that approaches twice the supply voltage $E_{DC}$ in magnitude. The net voltage that sweeps out the minority carriers is therefore of the same magnitude as $E_{DC}$. The inductor L1 limits the reverse current to the value $I_B$ shown in FIG. 3. This low reverse current value generates a reverse voltage drop across the SCR junction of only a few volts, and the inductor L1 absorbs most of the reverse voltage. Thus, the energy associated with the minority carrier sweep-out process is dissipated in resistor R2 connected across the secondary windings of inductor L1. Again, for high-frequency operation, this energy loss is appreciable.

As before stated a primary objective of this invention is to eliminate altogether both the priming loss dissipated in resistor R1 and the minority carrier sweep-out loss dissipated in resistor R2. The illustrative circuit of FIG. 4 is constructed in accordance with the invention to provide such lossless priming and minority carrier sweep-out. The circuit comprises a pair of successive saturable inductors L1 and L2 having respective primary, bias and secondary windings P-B-S and P'-B'-S', with diodes CR1 and CR2, linear inductor L3, resistor R1' and a DC bias supply, so-labelled. The primary windings P and P' are connected in series with SCR1. The bias windings B and B' are connected in series with L3, R1' and the DC bias supply. The secondary winding S of L1 is connected in series with diode CR1; and the secondary winding S' of L2 is connected in series with diode CR2. The operation of the circuit of FIG. 4 will now be described with the aid of the waveforms of FIGS. 5 and 6.

Initially, the C1 voltage is zero and L1 and L2 have been properly reset by the bias current, $I_b$. Such bias current drives L1 into negative saturation and L2 into positive saturation. Thus, when SCR1 is turned on at time $t_o$, FIGS. 5 and 6, the inductor L1 is driven into its unsaturated region, thereby limiting the priming current to the value $$(i_{SCR})\text{Priming} = (n_{b1}/n_{p1})I_b + i_{m1}, \quad (2)$$

where:

$n_{b1}$ = number of bias winding turns B on L1,
$n_{p1}$ = number of primary winding turns P on L1, and
$i_{m1}$ = magnetizing current of L1.

Figure 5:
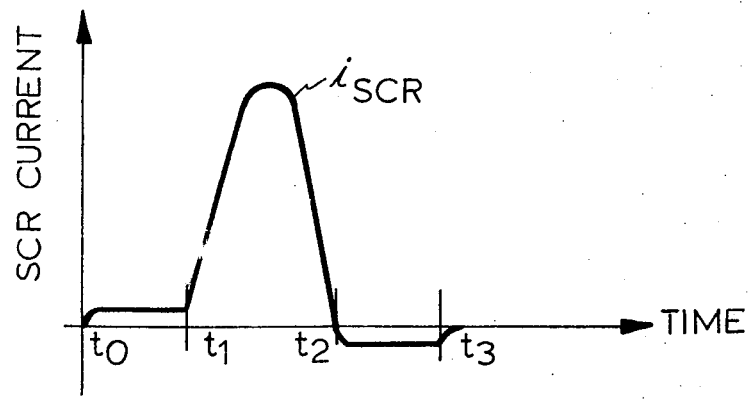
FIGS. 5 and 6 are respectively SCR current and inductor voltage waveforms generated in the apparatus of FIG. 4.

This priming current flows during the time-interval $t_o$ to $t_1$, in FIG. 5. During this time-interval, the L1 core is driven from negative to positive saturation by the voltage $E_{DC}$. The inductor L2, on the other hand, is driven further into positive saturation by the current $i_{SCR}$. At time $t_1$, inductor L1 saturates positively, and a large sinousoidal charging current starts to flow. The frequency, or period, of this current pulse is determined by the saturated inductances of L1 and L2 and the capacitance C1.

At time $t_2$, capacitor C1 is fully charged and the SCR1 current ($i_{SCR}$) reverses polarity, thus initiating the minority carrier sweep-out process. When the SCR1 current reverses polarity, the bias current $I_b$ starts to drive the L1 core into negative saturation. This generates a negative voltage across the L1 windings limited by the $E_{DC}$ voltage and the number of secondary turns on S, through the clamping action of CR1. The number of secondary winding turns S is selected such that the clamping voltage appearing across the primary winding P of L1 is slightly less than the sweep-out voltage. That is, $$E_{sweep\text{-}out} = (E_{C1})_{peak} - E_{DC}. \quad (3)$$

Thus, the remaining part of the sweep-out voltage appears across L2.

Figure 6:
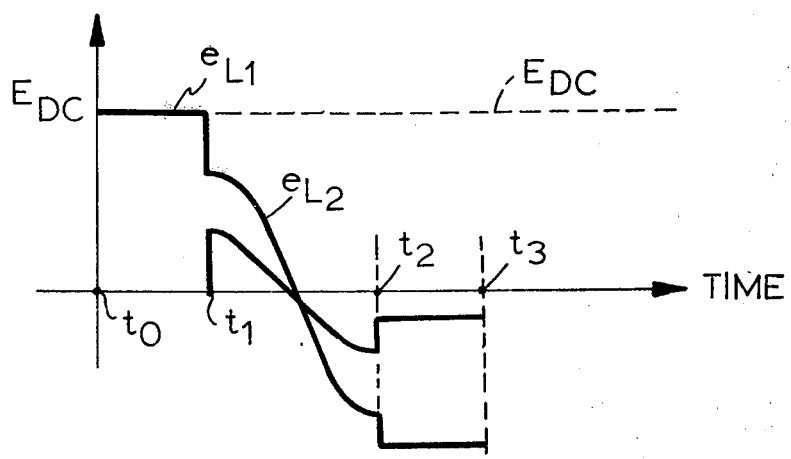

The voltage waveforms across L1 and L2 are shown in FIG. 6. Since the SCR1 sweep-out current is of the same polarity as the bias current for inductor L1, the sweep-out current aids the bias current in resetting L1. Further, since these two currents cause CR1 to conduct, there is no current-limiting function provided by L1 for the SCR1 sweep-out current. During this sweep-out process, however, inductor L2 provides the current-limiting function necessary to protect the SCR from failure. The SCR1 sweep-out current drives inductor L2 from positive toward negative saturation, with the sweep-out current being given by the expression:

$$(i_{SCR})_{sweep\text{-}out} = (n_{b2}/n_{p2})I_b + i_{m2}, \quad (4)$$

where:

$n_{b2}$ = number of bias winding turns B' on L2,
$n_{p2}$ = number of primary winding turns P' on L2, and
$i_{m2}$ = magnetizing current of L2.

Thus, as seen from Equations (2) and (4) above, the priming current and the sweep-out current can be independently adjusted in magnitude by the number of turns on the two bias windings B and B'; namely, $n_{b1}$ and $n_{b2}$.

At time $t_3$, the sweep-out process is complete, and the reverse voltage is absorbed by SCR1. When the sweep-out current drops to a low value (time $t_3$ in FIG. 5), the bias current drives the core of L2 back into positive saturation and by this action generates a positive voltage across the L2 primary winding P'. This voltage is clamped to the voltage $E_{DC}$ by means of the secondary winding S' and the diode CR2. Without this clamping action, the bias current would generate a large voltage spike across L1, thereby exceeding the voltage rating of the SCR and causing SCR failure.

In the circuit of FIG. 4, therefore, the energy associated with the priming and sweep-out processes is transferred back to the power supply by means of the L1 secondary winding S and CR1. During the priming time-interval, $t_o$ to $t_1$, the energy absorbed by L1 is actually transferred into the bias circuit, thus eliminating the losses of prior art priming circuits. During this interval, the L1 voltage is positive, thereby increasing the bias current and the stored energy in L3. Since R1' has a small resistance value, the additional losses in R1' are negligible. During the sweep-out time-interval, this additional energy stored in L3 is transferred to the power supply together with the energy associated with the sweep-out process, providing for the elimination of the prior art losses attendant upon such sweep-out operation, also.

Figure 7:
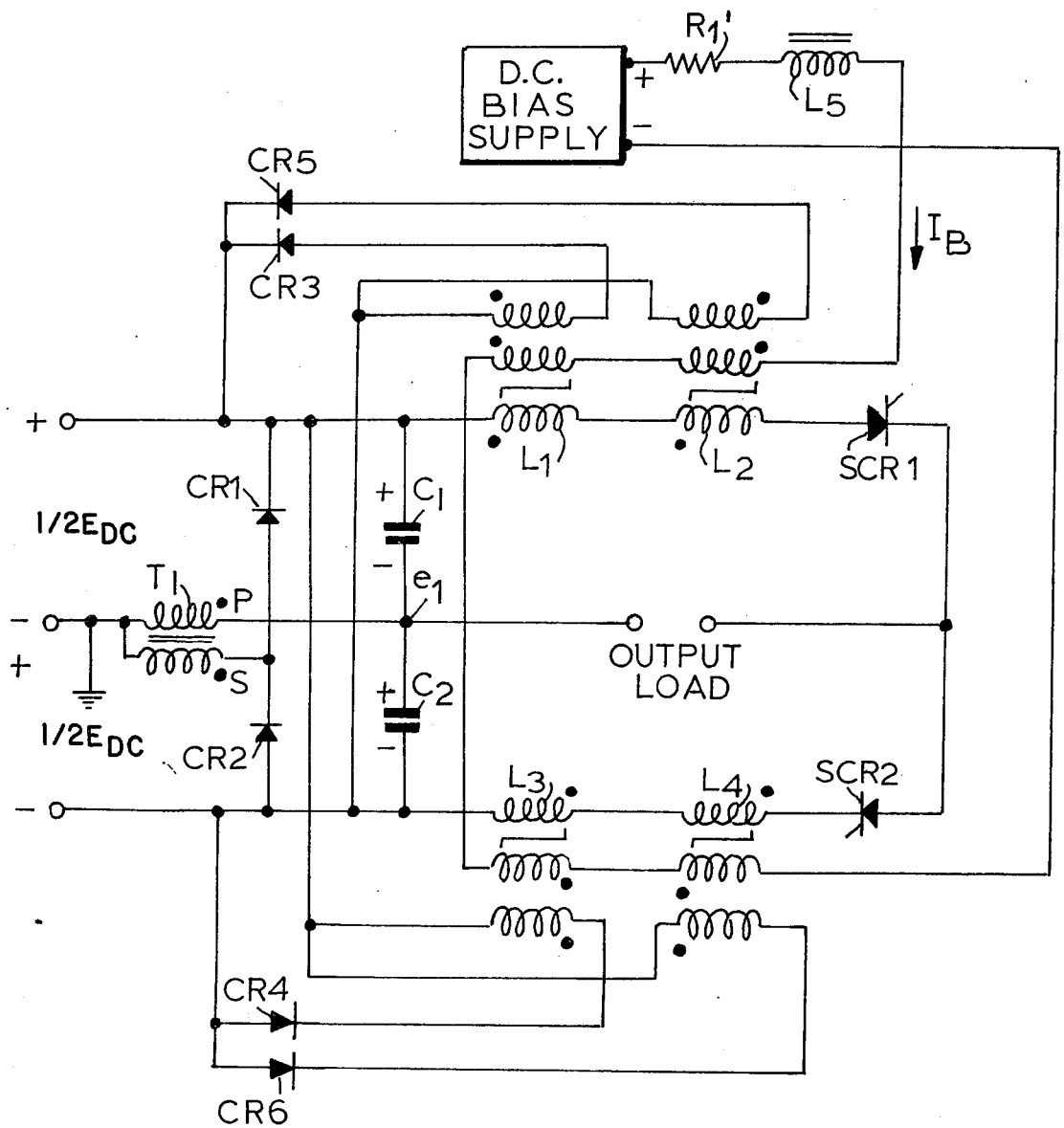
FIG. 7 is a circuit diagram of a modification.

A modified circuit for attaining these novel results is shown in FIG. 7, such circuit having novel advantages even apart from the priming and sweep-out features. This circuit generates both negative and positive sinusoidal current pulses, as shown in FIG. 8 (a). The circuit consists of capacitors C1 and C2; thyristor SCR1 in series with the first lossless priming and recovery circuit comprising inductors L1 and L2, diodes CR3 and CR5; thyristor SCR2 in series with a second lossless priming and recovery circuit comprising inductors L3 and L4, diodes CR4 and CR6; a DC bias supply with series elements R1' and L5; and a clamping circuit consisting of diodes CR1 and CR2, and transformer T1. The operation of the circuit is as follows. Initially, at time $t_0$, FIG. 8 (b), capacitor C1 is charged positively and capacitor C2 negatively. At time $t_0$, SCR1 is turned on, and a positive half sine-wave of current ($i_1$) is generated and delivered to the load during the time interval $t_0$ to $t_1$. At time $t_1$, both voltages on C1 and C2 have been reversed, such that the C2 voltage is positive ($e_{c2}$) and the C1 voltage is negative ($e_{c1}$). The next time interval, $t_1$ to $t_2$, must be sufficiently long to insure that SCR1 recovers. At time $t_2$, SCR2 is turned on, and a negative half-sine-wave of current ($i_2$) is generated and delivered to the load during the time interval $t_2$ to $t_3$. At time $t_3$, both voltages on C1 and C2 have been reversed, returning to the initial voltage polarities at time $t_0$. In the time interval $t_3$ to $t_4$, SCR2 recovers, and at time $t_4$, a new cycle of operation is initiated.

The relation between the forward and reverse capacitor voltages depends on the load characteristic. For a resistive load, energy is delivered to the load. Thus, for this case, the reverse capacitor voltage is less than the forward voltage, and this difference in capacitor voltage reflects the energy delivered to the load. For a regenerative load in which energy is delivered from the load to the pulse generator, on the other hand, the reverse capacitor voltage is greater then the forward voltage. For this last case, dangerous high voltages may be generated in the pulse generator circuit that may exceed the SCR maximum voltage rating. The clamping circuit (transformer T1 and oppositely poled diodes CR1 and CR2) eliminates these high voltages and thereby permits safe operation into regenerative loads.

When the load is resistive, the voltage at this common point is a symmetrical flat-topped wave shown as $e_1$ in FIG. 8(b). This voltage increases in magnitude when the load becomes reactive or regenerative. Even for a resistive load, the magnitude of the voltage $e_1$ exceeds the D.C. supply voltage $E_{DC}$. In order to clamp the $e_1$ voltage to a desired value, a secondary winding S is added to transformer T1. The turns ratio between the primary and secondary windings P and S is selected such that the secondary winding voltage is equal to one half the D.C. supply voltage ($E_{DC}$) when $e_1$ is equal to the desired clamping voltage. If $e_1$ increases beyond this value, either of the diodes CR1 and CR2 (depending upon voltage polarity) conducts and thus transfers energy back to the power supply. Thus, the voltage $e_1$ cannot exceed the clamping voltage level.

Further modifications will also occur to those skilled in this art, and all such are considered to fall within the spirit and scope of the invention as defined in the appended claims.

What is claimed is:

1. A method of eliminating priming and carrier sweep-out losses in SCR switching circuits associated with power supplies and in which energy is stored in response to SCR switching in such circuits, said method comprising delaying the rise of SCR current upon such switching for a predetermined priming interval, thereby also generating additional minority carriers in the SCR; limiting the current during the priming interval; generating a reverse voltage to effect sweep-out of such minority carriers during a sweep-out interval, limiting the current during the sweep-out interval; and transferring the energy resulting in each of said priming and sweep-out intervals back to said power supplies to eliminate heat dissipation of the said resulting energy.

2. A method as claimed in claim 1 and in which said delaying, generating and transferring are effected by saturable inductive field reversals.

3. A lossless SCR switching-circuit priming and sweep-out apparatus having, in combination with power supply means adapted to store energy that varies in response to SCR switching, saturable inductance means interposed between the power supply means and SCR means, part of the saturable inductance means being adjusted to provide limited priming current during a predetermined priming interval following switching of the SCR means, and part of said saturable inductance means being adjusted to provide a limited sweep-out current; and means connected with said saturable inductance means for transferring back to said power supply means energy resulting from the providing of said priming and sweep-out currents to eliminate heat dissipation of said currents in said circuit.

4. Apparatus as claimed in claim 3 and in which said power supply means includes a bias supply means and said saturable inductance means comprises a pair of successive saturable inductors each having primary, bias and secondary windings and with the primary windings connected in series with the SCR means, the bias windings connected to series with said bias supply means, and the secondary windings connected in series with oppositely poled diode means.

5. Apparatus as claimed in claim 4 and in which one of the pair of saturable inductors is adjusted to limit the said priming current substantially in accordance with the expression $$(i_{SCR})_{priming} = n_{b1}/n_{p1} I_b + i_{m1},$$

where $n_{b1}$ represents the number of turns on its bias winding, $n_{p1}$ represents the number of turns on its primary winding, $i_{m1}$ represents the inductor magnetizing current and $I_b$ represents the bias current; and in which said secondary winding of said one of the pair of saturable inductors assists in limiting the said priming current.

6. Apparatus as claimed in claim 5 and in which the other of the pair of saturable inductors is adjusted to limit the said sweep-out current substantially in accordance with the expression $$(i_{SCR})_{sweep-out} = n_{b2}/n_{p2} I_b + i_{m2},$$

where $n_{b2}$ represents the number of turns on its bias winding, $n_{p2}$ represents the number of turns on its primary winding, $i_{m2}$ represents the inductor magnetizing current and $I_b$ represents the bias current; and in which said secondary winding of said other of the pair of saturable inductors assists in current limiting to protect the SCR means.

7. Apparatus as claimed in claim 6 and in which means comprising the turns of the respective bias windings of the pair of saturable inductors is provided for enabling independent adjustment of the magnitude of the priming and sweep-out currents, respectively.

8. Apparatus as claimed in claim 6 and in which said bias windings are connected in series with a resonant charging inductance with said bias supply means of the power supply means.

9. Apparatus as claimed in claim 3 and in which the apparatus is connected to feed a regenerative load wherein the voltage of the energy transferred back to said power supply means may exceed the maximum voltage rating of the SCR means, said apparatus being further provided with transformer means, the primary winding of which connects to the load and the secondary winding of which connects to oppositely poled diode clamping means connected to the power supply means to prevent voltages which would exceed said rating.

10. Apparatus as claimed in claim 9 and in which said power supply means comprises a pair of power supplies having oppositely poled outputs connected to said load and having a pair of series connected capacitors connected between said outputs, and said primary winding connects to the point of series connection of the capacitors, and said diode clamping means are series-connected across said capacitors with the point of series connection of the diode clamping means being connected to said secondary winding.

11. An SCR switching-circuit apparatus having, in combination with a pair of series connected power supplies provided with a pair of capacitors connected in series across the power supplies for storing energy that varies in response to switching of SCR means, a regenerative load connected to receive the stored energy and wherein the voltage of the energy may exceed the maximum voltage rating of the SCR means, and means for clamping the voltage of said energy to prevent it from exceeding said rating, comprising transformer means the primary winding of which connects to the point of series connection of the capacitors and to the load, the diode means series-connected across said capacitors with the point of series connection of the diode means being connected to a secondary winding of the transformer means.

* * * * *